United States Patent
Stahlhut

(10) Patent No.: US 11,320,493 B2
(45) Date of Patent: May 3, 2022

(54) ELECTRIC SHORT-CIRCUIT DEVICE

(71) Applicant: Siemens Energy Global GmbH & Co. KG, Munich (DE)

(72) Inventor: Nils Stahlhut, Roettenbach (DE)

(73) Assignee: Siemens Energy Global GmbH & Co. KG, Munich (DE)

(*) Notice: Subject to any disclaimer, the term of this patent is extended or adjusted under 35 U.S.C. 154(b) by 295 days.

(21) Appl. No.: 16/622,550

(22) PCT Filed: Jul. 7, 2017

(86) PCT No.: PCT/EP2017/067105
§ 371 (c)(1),
(2) Date: Dec. 13, 2019

(87) PCT Pub. No.: WO2019/007532
PCT Pub. Date: Jan. 10, 2019

(65) Prior Publication Data
US 2020/0241080 A1 Jul. 30, 2020

(51) Int. Cl.
*G01R 31/14* (2006.01)
*G01R 31/52* (2020.01)
(Continued)

(52) U.S. Cl.
CPC ........... *G01R 31/52* (2020.01); *G01R 31/281* (2013.01); *H01H 79/00* (2013.01); *H02H 3/20* (2013.01)

(58) Field of Classification Search
CPC ...... G01R 31/52; G01R 31/281; H01H 79/00; H02H 3/05; H02H 3/08; H02H 3/16;
(Continued)

(56) References Cited

U.S. PATENT DOCUMENTS 4,769,734 A * 9/1988 Heinemeyer ........... F42C 15/40
102/202.4
5,578,976 A 11/1996 Yao
(Continued)

FOREIGN PATENT DOCUMENTS

CN 1209865 A 3/1999
CN 1253668 A 5/2000
(Continued)

OTHER PUBLICATIONS

Igarashi D et al: "Power converter device for direct current substation for carrying out power conversion between alternating current and direct current, comprises converter that has direct current condenser provided with two switching elements"; Database WPI, Week 201360, Thomson Scientific, London, GB; AN 2013-M77476; XP002779154, -& JP 2013 169088 A (Hitachi Ltd), abstract: fig. 1-2, fig. 4-7; 2013.
(Continued)

*Primary Examiner* — Thang X Le
(74) *Attorney, Agent, or Firm* — Laurence A. Greenberg; Werner H. Sterner; Ralph E. Locher

(57) ABSTRACT

An electric short-circuit device has a first electric contact piece, a second electric contact piece, and a component made of an electrical semiconductor crystalline material which blocks the flow of an electric current between the first contact piece and the second contact piece in at least one direction. An actuator is configured to apply a mechanical force to the component in response to an electric trigger signal and thereby at least partly destroy the crystalline structure of the component.

18 Claims, 5 Drawing Sheets

(51) Int. Cl.
*G01R 31/28* (2006.01)
*H01H 79/00* (2006.01)
*H02H 3/20* (2006.01)

(58) Field of Classification Search
CPC ..... H02H 3/20; H01L 41/083; H01L 41/0471; H01L 41/0553
See application file for complete search history.

(56) References Cited

U.S. PATENT DOCUMENTS

| | | | |
|---|---|---|---|
| 6,172,445 | B1 | 1/2001 | Heinz et al. |
| 6,188,555 | B1 | 2/2001 | Mitlehner et al. |
| 9,634,554 | B2 | 4/2017 | Falk et al. |
| 2004/0124747 | A1 | 7/2004 | Bugel et al. |
| 2006/0181178 | A1 | 8/2006 | Kastl et al. |
| 2006/0238070 | A1 | 10/2006 | Costa et al. |
| 2008/0048528 | A1 | 2/2008 | Schoor |
| 2008/0289426 | A1 | 11/2008 | Kearns et al. |
| 2009/0250267 | A1 | 10/2009 | Heubel et al. |
| 2010/0032275 | A1* | 2/2010 | Meier ............ H01H 9/548 200/502 |
| 2012/0267632 | A1 | 10/2012 | Ramaswamy et al. |
| 2014/0146211 | A1 | 5/2014 | Mori et al. |
| 2015/0162738 | A1* | 6/2015 | Wikstrom .......... H02H 3/023 361/101 |
| 2016/0176187 | A1 | 6/2016 | Guidotti et al. |
| 2016/0365443 | A1 | 12/2016 | Meiser et al. |
| 2017/0077382 | A1 | 3/2017 | Abraham et al. |
| 2017/0084551 | A1* | 3/2017 | Limb ............... H01L 23/15 |

FOREIGN PATENT DOCUMENTS

| | | |
|---|---|---|
| CN | 1647290 A | 7/2005 |
| CN | 1774822 A | 5/2006 |
| CN | 1977402 A | 6/2007 |
| CN | 101785124 A | 7/2010 |
| CN | 103703759 A | 4/2014 |
| CN | 105579234 A | 5/2016 |
| CN | 106252413 A | 12/2016 |
| DE | 202014104564 U1 | 11/2014 |
| JP | S4725838 U | 11/1972 |
| JP | H0917300 A | 1/1997 |
| JP | 2013027260 A | 2/2013 |
| JP | 2013169088 A | 8/2013 |
| KR | 970051619 A | 7/1997 |
| KR | 20140002032 A | 1/2014 |
| SU | 1341690 A1 | 9/1987 |
| WO | WO 2011107363 A1 | 9/2011 |

OTHER PUBLICATIONS

Davies M et al: "HVDC Plus—Basics and Principle of Operation", published by Siemens AG; 2009.
Guanjun Ding, et al.: "New technologies of voltage source converter (VSC) for HVDC transmission system based on VSC", Power and Energy Society General Meeting—Conversion and Delivery of Electrical Energy in The 21 st Century, 2008 IEEE, IEEE, Piscataway, NJ, USA, pp. 1-8, XP031304187, ISBN: 978-1-4244-1905-0, III. Protection Measures of Submodule; 2008.
Alstom: "Selbstgeführte Stromrichter für Hochspannungsanwendungen: eine zukunftsweisende Übertragungstechnologie", Thema, ALSTOM Thinkgrid; 2011.
Kamyshnyi, A., et al.: "Single action circuit breaker—uses mass produced semiconductor device with pressing contacts", Database WPI, Week 198818, Thomson Scientific, London, GB; AN 1988-124943, XP002779153. -& SU 1 341 690 A (Kamshnyi An), abstract; 1987.
Infineon: "Bipolare Halbleiter"—Technische Information, Infineon Technologies Bipolar GmbH & Co. KG, ifbip.com, www.ifbip-shop.com; 2012.

* cited by examiner

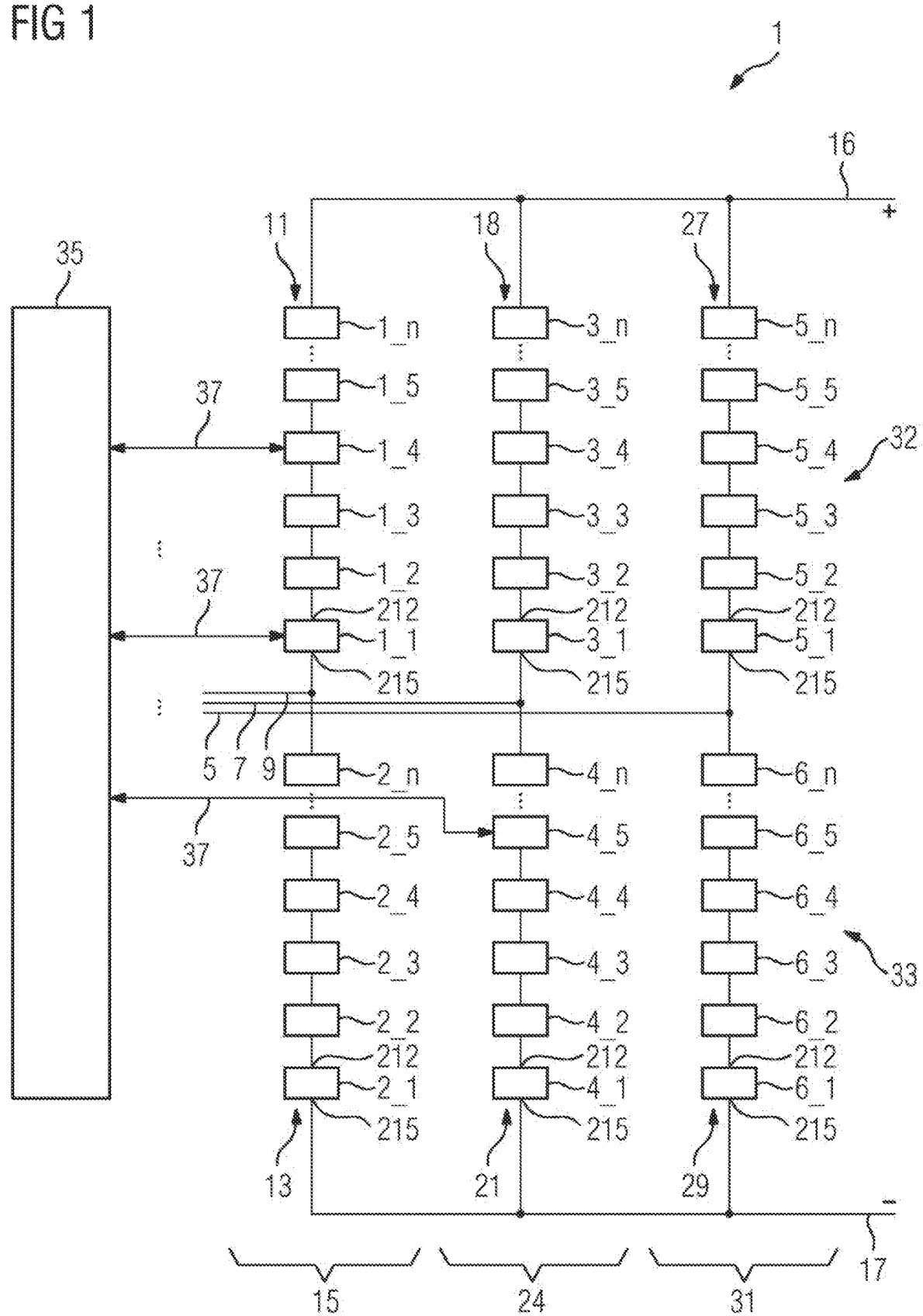

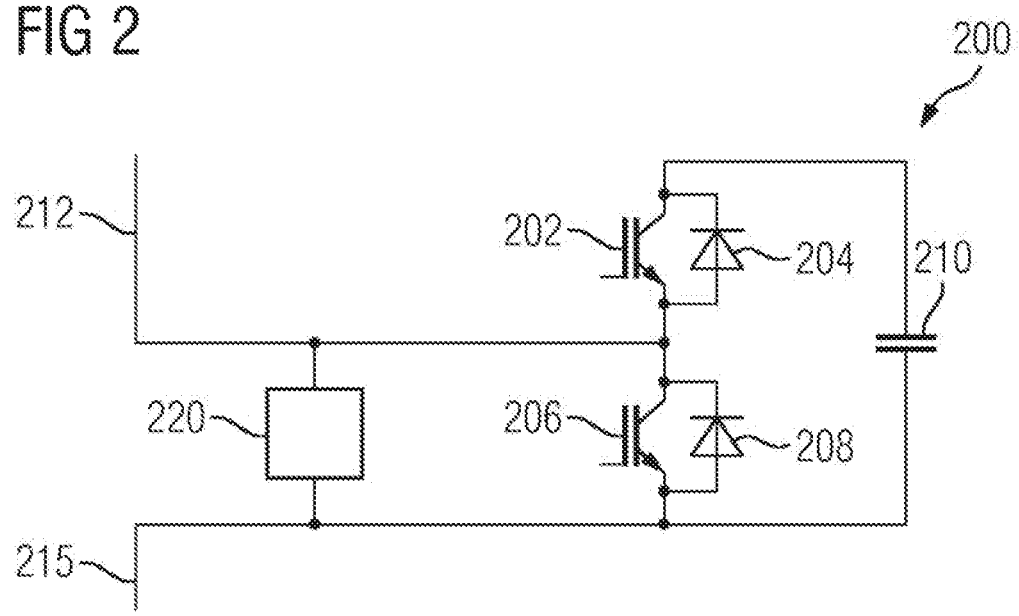
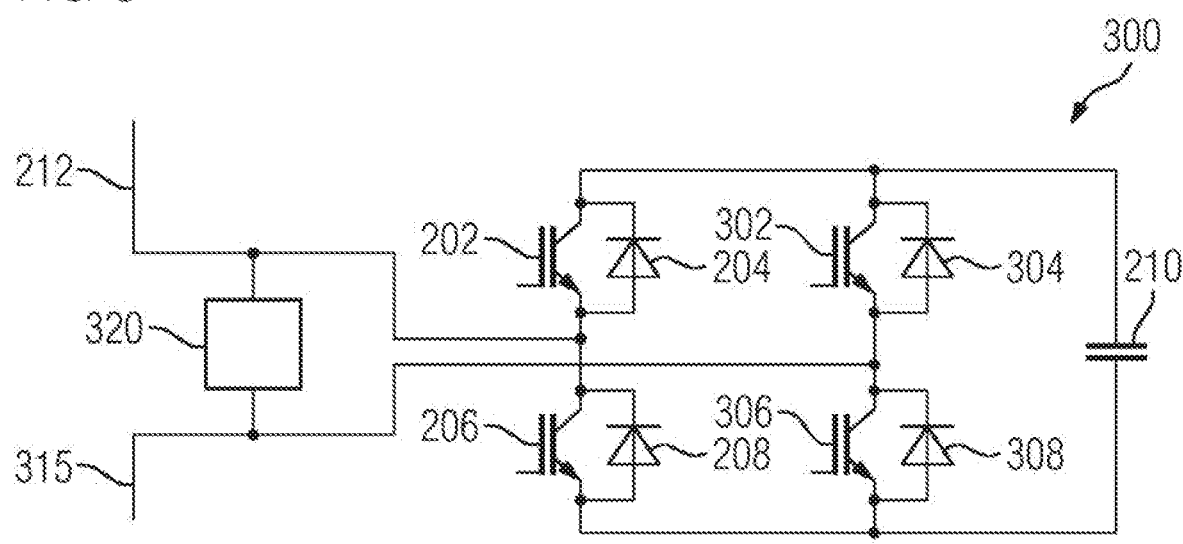

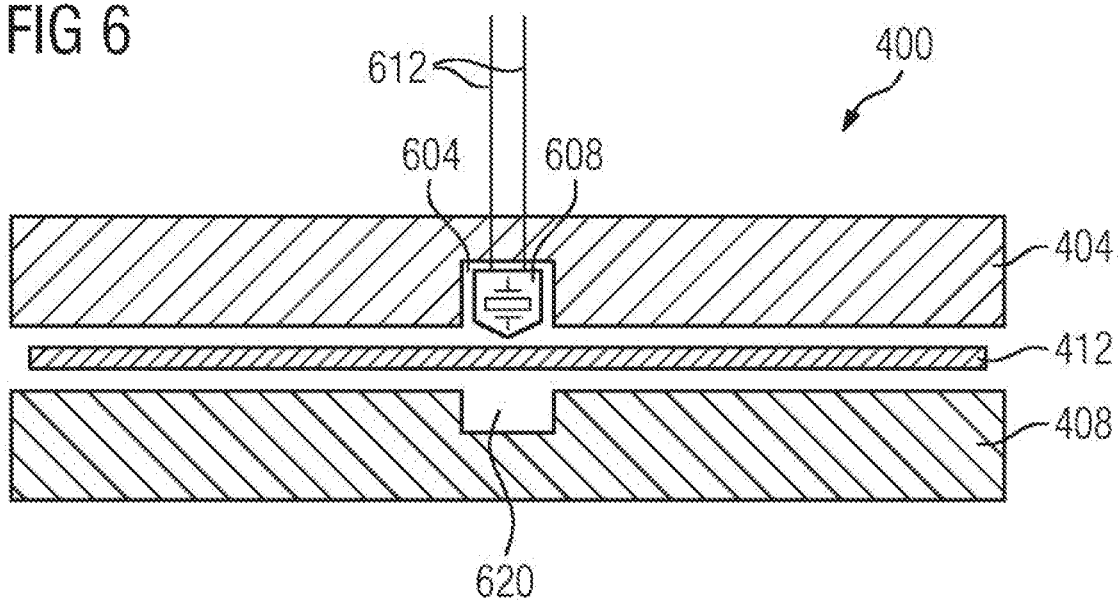
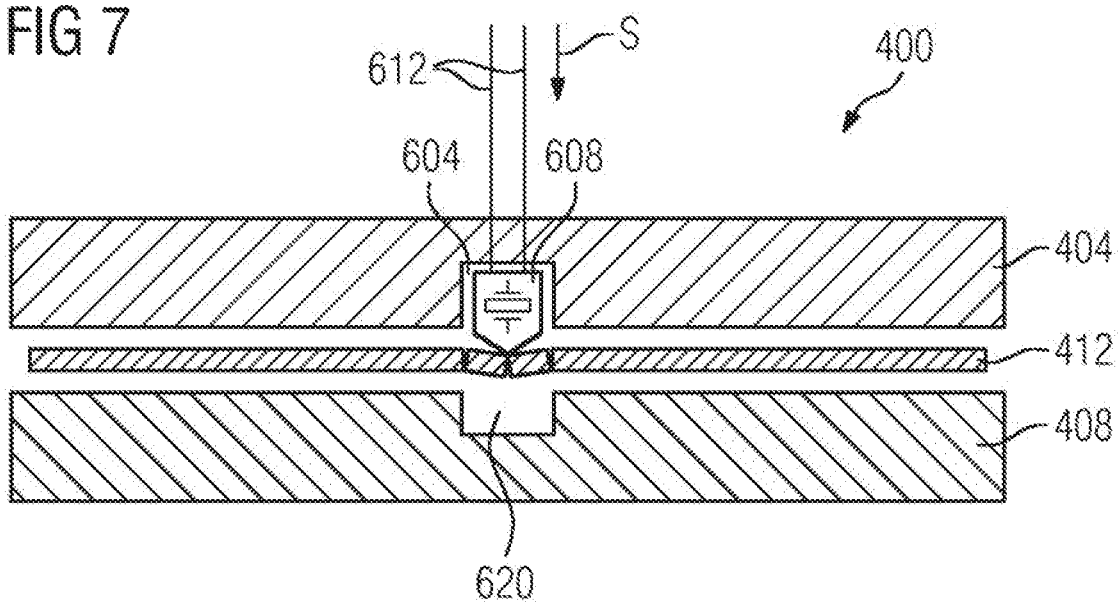

ELECTRIC SHORT-CIRCUIT DEVICE

BACKGROUND OF THE INVENTION

Field of the Invention

The invention relates to an electric short-circuit device. The necessity of short-circuiting (bridging) certain circuit parts sometimes arises in electric circuits. There are, for example, power converters that comprise a large number of electric modules connected in series. If one of the modules breaks down during operation, it is desirable to short-circuit (bridge) this defective module so that the other modules of the electric series circuit can continue to be operated.

An electric short-circuit device with a pyrotechnic drive is known from the international patent application WO 2011/107363 A1. The pyrotechnic drive enables fast closure of the short-circuit device, but sometimes causes problems related to safety (explosive material).

SUMMARY OF THE INVENTION

The invention is based on the object of providing a short-circuit device and a method for short-circuiting a module wherein no pyrotechnic drive is required.

This object is achieved according to the invention by an electric short-circuit device and by a method in accordance with the independent claims. Advantageous forms of embodiment of the short-circuit device and of the method are given in the dependent claims.

An electric short-circuit device (bridging device) is disclosed with a first electric contact piece and a second electric contact piece, with a component made of an electrically semiconducting crystalline material which blocks a flow of electric current between the first contact piece and the second contact piece in at least one direction, and with an (electric) actuator (drive element) that is designed to apply a mechanical force to the component in response to an electric trigger signal and thereby at least partly destroy the crystal structure of the component. The actuator can also be designed to apply a mechanical force to the component in response to the electric trigger signal and thereby destroy the material. As a result of the at least partially destroyed crystal structure of the semiconducting crystalline material said material loses its electrically blocking capacity, so that as a result a flow of electric current between the first contact piece and the second contact piece is enabled in the originally blocked direction. This process is also referred to as breakdown. Even just fine cracks or fractures in the crystal structure of the crystalline material can be sufficient to nullify the electrically blocking properties of the short-circuit device. It is, of course, however, also possible to break the semiconducting crystalline material into a plurality of fragments (visible with the naked eye) by means of the mechanical force. The actuator is, in general, an element that converts an electric signal into a mechanical movement.

The short-circuit device can be designed such that the component is arranged between the first contact piece and the second contact piece. The component can, in particular, be clamped between the first contact piece and the second contact piece. In the short-circuited state the electric current advantageously flows from one of the contact pieces through the component to another of the contact pieces, depending on the direction of the current.

The short-circuit device can be designed such that the short-circuit device is designed as a disk cell. The short-circuit device can in this way be designed to be mechanically very compact and robust. The first contact piece and the second contact piece here are essentially aligned parallel to one another.

The short-circuit device can also be designed such that the first contact piece comprises a first recess in which the actuator is arranged. The actuator arranged in the first recess can directly act mechanically on the component.

The short-circuit device can also be designed such that the second contact piece comprises a second recess that is arranged opposite the first recess. The second recess allows the component to deform in response to the mechanical force. This has the effect that the crystal structure of the component is partially destroyed in response to the mechanical force.

The short-circuit device can be designed such that the component separates the first recess from the second recess.

The short-circuit device can also be designed such that the component is a disk (made of the electrically semiconducting crystalline material). Such a disk is also referred to as a wafer. Because disks of this sort can be made comparatively thin, it is possible to destroy the crystal structure of the crystalline material with a comparatively small actuator and/or a small electric trigger signal.

The short-circuit device can be designed such that the component comprises at least one p-n junction, in particular two p-n junctions, aligned in opposite directions.

If the component only comprises one p-n junction (that is if the component, for example, corresponds to an electric diode), then when in not in the short-circuiting state it is able to block the electric current in one direction. If the component comprises two p-n junctions with opposite orientations (that is if the component, for example, corresponds to a thyristor), then when not in the short-circuiting state the component is able to block electric current in both directions.

The short-circuit device can also be designed such that the at least one p-n junction is a planar p-n junction that is aligned parallel to the first electric contact piece and/or parallel to the second electric contact piece. By means of one or a plurality of such planar p-n junctions even large electric currents can be carried safely when the short-circuit device is in the short-circuiting state.

The short-circuit device can also be designed such that the actuator is an (electric) piezo actuator. A piezo actuator of this sort has, in particular, the advantage that it generates a mechanical movement very quickly in response to the electric trigger signal, and is therefore able to apply the mechanical force to the component very quickly in response to the electric trigger signal.

The short-circuit device can also be designed such that
  the component is an electrically switchable semiconductor element (in particular a thyristor) whose control terminal (in particular its gate terminal) is brought out of the short-circuit device, so that the semiconductor component can also be switched on (electrically) by means of its control terminal.

A power converter with a plurality of (identical) two-pole modules (submodules) that are connected electrically in series is furthermore disclosed, wherein a respective electric short-circuit device according to one of the variants described above is assigned (in particular connected in parallel) to each of the modules (so that the modules can be short-circuited (bridged) by means of the short-circuit device respectively assigned to them).

This power converter can, in particular, be a modular multilevel power converter.

A method for short-circuiting an electric two-pole module is furthermore disclosed, wherein an electric short-circuit device that comprises a first electric contact piece, a second electric contact piece and a component made of an electrically semiconducting crystalline material is connected in parallel with the module, wherein in the method a flow of electric current between the first contact piece and the second contact piece is initially blocked by the component in at least one direction, the component is subjected to a mechanical force by an actuator in response to an electric trigger signal, and the crystal structure of the component is thereby at least partially (mechanically) destroyed, as a result of which (the component breaks down and) the flow of electric current between the first electric contact piece and the second electric contact piece in the originally blocked direction is enabled.

This method can be designed such that the electric module comprises at least two electronic switching elements and an electric energy store.

The method can also be designed such that the electric module is a module (submodule) of a modular multilevel power converter.

The method can also be designed such that the component is a disk (made of the electrically semiconducting crystalline material).

The short-circuit device can be designed such that the actuator is an (electric) piezo actuator.

The method has the same advantages as are presented above in connection with the short-circuit device.

The invention is explained in more detail below with reference to exemplary embodiments. The same reference signs here refer to elements that are the same or that have the same effect. Here

BRIEF DESCRIPTION OF THE SEVERAL VIEWS OF THE DRAWING

FIG. 1 shows an exemplary embodiment of a power converter that comprises a plurality of modules, FIG. 2 shows an exemplary embodiment of a module with a short-circuit device, FIG. 3 shows a further exemplary embodiment of a module with a short-circuit device, FIG. 6 shows a sectional illustration of the exemplary embodiment of the short-circuit device, FIG. 7 shows a sectional view of the exemplary embodiment of the short-circuit device after the trigger signal.

DESCRIPTION OF THE INVENTION

Figure 4:
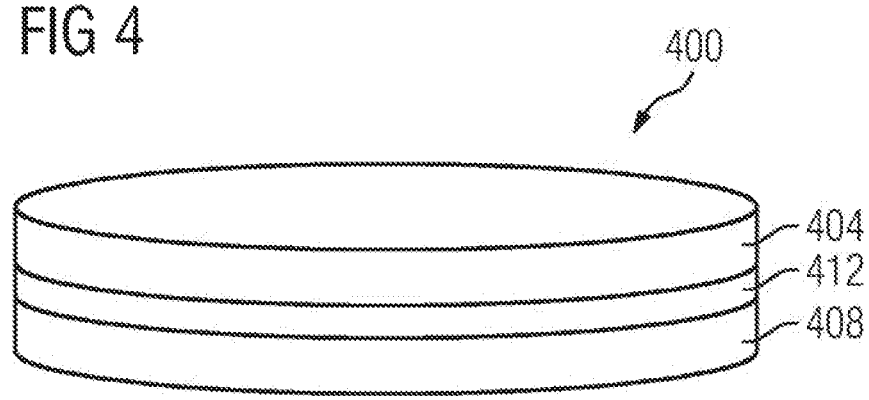
FIG. 4 shows a three-dimensional illustration of an exemplary embodiment of a short-circuit device.

A power converter 1 in the form of a modular multilevel power converter 1 (MMC) is illustrated in FIG. 1. This multilevel power converter 1 comprises a first alternating voltage terminal 5, a second alternating voltage terminal 7 and a third alternating voltage terminal 9. The first alternating voltage terminal 5 is connected electrically to a first phase module branch 11 and a second phase module branch 13. The first phase module branch 11 and the second phase module branch 13 form a first phase module 15 of the power converter 1. The end of the first phase module branch 11 that faces away from the alternating voltage terminal 5 is connected electrically to a first direct voltage terminal 16; the end of the second phase module branch 13 that faces away from the first alternating voltage terminal 5 is connected electrically to a second direct voltage terminal 17. The first direct voltage terminal 16 is a positive direct voltage terminal; the second direct voltage terminal 17 is a negative direct voltage terminal.

The second alternating voltage terminal 7 is connected electrically to one end of a third phase module branch 18 and to one end of a fourth phase module branch 21. The third phase module branch 18 and the fourth phase module branch 21 form a second phase module 24. The third alternating voltage terminal 9 is connected electrically to one end of a fifth phase module branch 27 and to one end of a sixth phase module branch 29. The fifth phase module branch 27 and the sixth phase module branch 29 form a third phase module 31.

The end of the third phase module branch 18 that faces away from the second alternating voltage terminal 7 and the end of the fifth phase module branch 27 that faces away from the third alternating voltage terminal 9 are connected electrically to the first direct voltage terminal 16. The end of the fourth phase module branch 21 that faces away from the second alternating voltage terminal 7 and the end of the sixth phase module branch 29 that faces away from the third alternating voltage terminal 9 are connected electrically to the second direct voltage terminal 17. The first phase module branch 11, the third phase module branch 18 and the fifth phase module branch 27 form a positive-side power converter part 32; the second phase module branch 13, the fourth phase module branch 21 and the sixth phase module branch 29 form a negative-side power converter part 33.

Each phase module branch comprises a plurality of modules (1_1, 1_2, 1_3, 1_4 . . . 1_n; 2_1 . . . 2_n; etc.), which are connected electrically in series (by means of their galvanic current terminals). Such modules are also referred to as submodules. In the exemplary embodiment of FIG. 1, each phase module branch comprises n modules. The number of modules connected electrically in series by means of their galvanic current terminals can vary greatly; at least three modules are connected in series, but also, for example, 50, 100 or more modules can be connected electrically in series. In the exemplary embodiment, n=36: the first phase module branch 11 thus comprises 36 modules 1_1, 1_2, 1_3, . . . 1_36. The other phase module branches 13, 18, 21, 27 and 29 have the same construction.

A control device 35 for the modules 1_1 to 6_n is illustrated schematically in the left-hand part of FIG. 1. Optical messages or optical signals are transmitted over an optical communication connection 37 (over an optical fiber, for example) to the individual modules from this central control device 35. The transmission of messages between the control device and a module is in each case symbolically illustrated by a line 37; the direction of the message transmission is symbolized by the arrow tips at the lines 37. This is illustrated using the example of modules 1_1, 1_4 and 4_5; messages are transmitted to the other modules, or messages received from these modules, in the same manner. The control device 35 sends, for example, in each case, a setpoint value for the height of the output voltage that the respective module should provide to the individual modules.

An exemplary embodiment of a module 200 of the power converter 1 is illustrated in FIG. 2. This can, for example, be one of the modules 1_1 ... 6_n illustrated in FIG. 1.

The module 200 is designed as a half-bridge module 200. The module 200 comprises a first electronic switching element 202 (which can be switched off) (first semiconductor valve 202 that can be switched off) with a first diode 204 connected antiparallel. The module 200 further comprises a second electronic switching element 206 (which can be switched off) (second semiconductor valve 206 which can be switched off) with a second diode 208 connected antiparallel, as well as an electric energy store 210 in the form of a capacitor 210. The first electronic switching element 202 and the second electronic switching element 206 are each designed as an IGBT (insulated-gate bipolar transistor). The first electronic switching element 202 is connected electrically in series with the second electronic switching element 206. A first galvanic module terminal 212 is arranged at the connection point between the two electronic switching elements 202 and 206. A second galvanic module terminal 215 is arranged at the terminal of the second electronic switching element 206 which is opposite to the connection point. The second module terminal 215 is furthermore connected electrically to a first terminal of the energy store 210; a second terminal of the energy store 210 is connected electrically to the terminal of the first electronic switching element 202 that is opposite to the connection point.

The energy store 210 is thus connected electrically in parallel with the series circuit of the first electronic switching element 202 and the second electronic switching element 206. Through appropriate drive of the first electronic switching element 202 and the second electronic switching element 206 by an electronic control device (not illustrated) of the power converter, it is possible to ensure that either the voltage of the energy store 210 is output between the first module terminal 212 and the second module terminal 215, or that no voltage is output (i.e. a zero voltage is output). Through the interaction of the modules of the individual phase module branches, the output voltage of the power converter desired at a given time can thus be generated.

A short-circuit device 220 is connected in parallel with the module 200. The short-circuit device 220 is thus connected between the first module terminal 212 and the second module terminal 215. When the short-circuit device 220 enters the short-circuited state/short-circuiting state, the short-circuit device 220 then bridges the module 200; the short-circuit device 220 short-circuits the module 200. The operating current of the power converter then flows, for example, from the first module terminal 212, via the short-circuit device 220, to the second module terminal 215 (and not via the other components of the module 200, in particular not via the switching elements 202, 206 and the diodes 204, 208).

A further exemplary embodiment of a module 300 of the power converter 1 is illustrated in FIG. 3. This can, for example, be one of the modules 1_1 ... 6_n illustrated in FIG. 1. In addition to the first electronic switching element 202, the second electronic switching element 206, first freewheeling diode 204, second freewheeling diode 208 and energy store 210 already known from FIG. 2, the module 300 illustrated in FIG. 3 comprises a third electronic switching element 302 with a third freewheeling diode 304 connected antiparallel, as well as a fourth electronic switching element 306 with a fourth freewheeling diode 308 connected antiparallel. The third electronic switching element 302 and the fourth electronic switching element 306 are each designed as an IGBT. In contrast to the circuit of FIG. 2, the second module terminal 315 is not connected electrically to the second electronic switching element 206, but to a central point of an electric series circuit consisting of the third electronic switching element 302 and the fourth electronic switching element 306.

The module 300 in FIG. 3 is what is known as a full-bridge module 300. This full-bridge module 300 is characterized in that with appropriate drive of the four electronic switching elements between the first (galvanic) module terminal 212 and the second (galvanic) module terminal 315, optionally either the positive voltage of the energy store 210 or the negative voltage of the energy store 210, or a voltage with the value zero (zero voltage) can be output. The polarity of the output voltage can thus be reversed by means of the full-bridge module 300. The multilevel power converter 1 can comprise either just half-bridge modules 200 or just full-bridge modules 300, or also half-bridge modules 200 and full-bridge modules 300.

A short-circuit device 320 is connected in parallel with the module 300. The short-circuit device 320 is thus connected between the first module terminal 212 and the second module terminal 315. When the short-circuit device 320 enters the short-circuited state/short-circuiting state, the short-circuit device 320 then bridges the module 300; the short-circuit device 320 short-circuits the module 300. The operating current of the power converter then flows, for example, from the first module terminal 212, via the short-circuit device 320, to the second module terminal 315 (and not via the other components of the module 300, in particular not via the switching elements 202, 206, 302, 306 and/or the diodes 204, 208, 304, 308). The short-circuit device 320 can be constructed like the short-circuit device 220.

An external view of an exemplary embodiment of a short-circuit device 400 is shown schematically in FIG. 4. This short-circuit device 400 can, for example, either be the short-circuit device 220 or the short-circuit device 320.

The short-circuit device 400 has essentially the external form of a straight, circular cylinder with a comparatively low height, which is to say the shape of what is known as a disk cell 400. A first electric contact piece 404, a second electric contact piece 408, and a component 412 consisting of an electrically semiconducting crystalline material arranged between the first electric contact piece 404 and the second electric contact piece 408 are indicated schematically.

Figure 5:
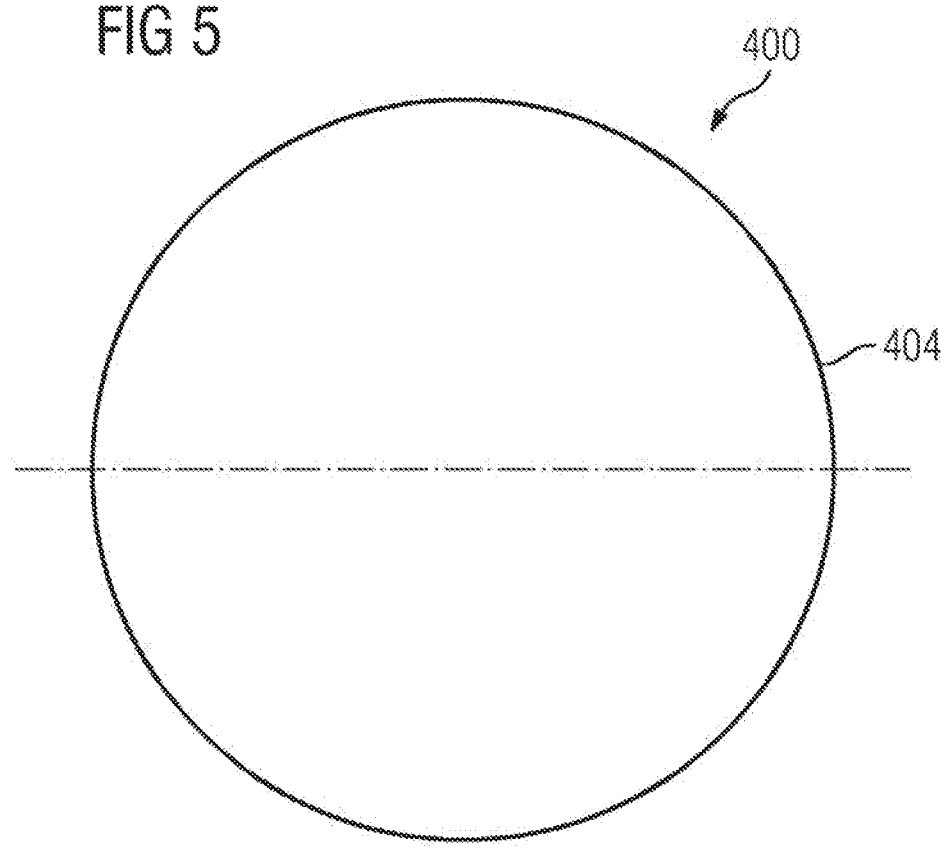
FIG. 5 shows a plan view of the exemplary embodiment of the short-circuit device.

The first electric contact piece 404 can be designed as a first pressure element 404; the second electric contact piece 408 can be designed as a second pressure element 408. The component 412 can be braced/clamped between the first pressure element 404 and the second pressure element 408. The first electric contact piece 404 in the second electric contact piece 408 can consist of a metal, of copper, for example. A plan view of the short-circuit device 400 is illustrated schematically in FIG. 5. A section along the diameter of the short-circuit device 400 is indicated in FIG. 5 by means of a dot-dash line. The associated sectional illustrations are shown in FIGS. 6 and 7.

A sectional view through the short-circuit device 400 in the not-short-circuited state is illustrated schematically in FIG. 6. This not-short-circuited state (not-short-circuiting state) corresponds to an open switch. The first contact piece 404 and the second contact piece 408 each have the basic shape of a straight, circular cylinder. The first contact piece 404 comprises a first recess 604 in which an actuator 608 is arranged. The first recess 604 is a central recess 604. In the exemplary embodiment, the first recess 604 has a rotationally symmetrical design.

The actuator 608 converts an electric signal (trigger signal) into a mechanical movement. By means of the mechanical movement, the actuator 608 is able to apply a mechanical force to the component 412. The actuator 608 comprises two terminals 612 via which the electric trigger signal is fed to the actuator 608. In the exemplary embodiment, the actuator is a piezoelectric actuator 608. This piezoelectric actuator 608 converts the signal into a mechanical movement by means of a piezoelectric crystal. The force is thereby applied to the component 412. The piezoelectric crystal is indicated in the schematically illustrated actuator 608.

A second recess 620 is arranged in the second contact piece 408. This second recess 620 is arranged opposite the first recess 604. The component 412 is arranged between the first contact piece 404 and the second contact piece 408. The component 412 thus separates the first recess 604 from the second recess 620. The component 412 in the exemplary embodiment is a disk composed of an electrically semiconducting, crystalline material.

In the exemplary embodiment, the first recess 604 and the second recess 620 are designed complementary to one another. The second recess 620 represents an expansion recess (an expansion chamber, for example). This second recess 620 makes it possible for the component 412 to be mechanically deformed (in the direction of the second recess 620) in response to the mechanical force, and thereby for the crystal structure of the component 412 to be at least partially (in particular at least locally) destroyed.

The short-circuit device 400 is illustrated schematically in the short-circuiting state in FIG. 7. In response to an electric trigger signal S the actuator 608 has applied a mechanical force to the component 412. The component 412 has been bent in the direction of the second recess 620 by the force, as a result of which the component 412 is fractured. This fracturing of the component 412 is illustrated, coarsely and schematically, in FIG. 7. It is entirely adequate if, as a result of the application of the force, small cracks form in the crystal structure of the component 412 and if the crystal structure of the component is thereby at least partially destroyed.

Through this destruction of the crystal structure of the component, the component 412 is no longer able to block the flow of electric current, and the electric current can now flow, for example, from the first contact piece 404, through the component 412 to the second contact piece 408. The electrically semiconducting crystalline material of the component 412 is flooded with charge carriers, and thereby conductive. This process is also referred to as breakdown. As a result, the first contact piece 404 is short-circuited to the second contact piece 408, and the electric short-circuit device 400 is in its short-circuited (short-circuiting) state.

Stated in different words, the acting force of the actuator 608 is oriented to the component 412. To switch the short-circuit device 400 on, the electric trigger signal S is applied (for example with a voltage pulse) to the actuator 608. The force of the actuator 608 arising as a result acts on the component 412, pushes the component into the second recess 620, and thereby fractures the component 412. As a result of the consequent fracture in the crystal microstructure, the component 412 loses its insulating or blocking properties, and ensures a reliable short-circuit between the first contact piece 404 and the second contact piece 408 (the component 412 breaks down).

It is to be noted that in FIGS. 6 and 7, a space is shown between the first contact piece 404 and the component 412 as well as between the component 412 and the second contact piece 408, for the sake of easier recognition. This space is however only present for reasons of better clarity. In reality, in a fully assembled short-circuit device no such large distance is as a rule present between the first contact piece 404 and the component 412 and between the component 412 and the second contact piece 408. The component 412 is, rather, clamped between the first contact piece 404 and the second contact piece 408; the component 412 is held by the contact pieces 404 and 408.

Figure 8:
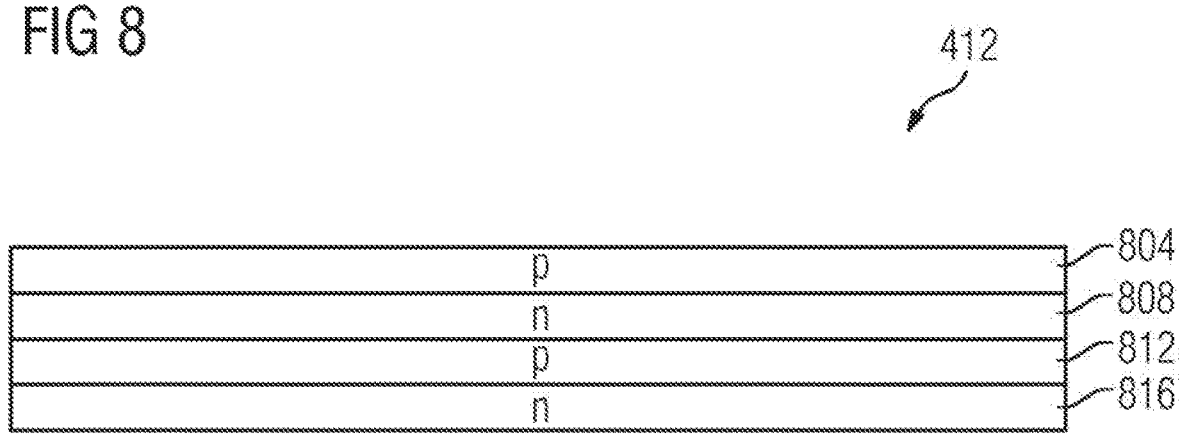
FIG. 8 shows an exemplary embodiment of a component made of an electrically semiconducting material.

A sectional view of an exemplary possible structure of the component 412 is shown schematically in FIG. 8. The component is designed as a disk 412 of monocrystalline or polycrystalline silicon. The disk 412 comprises four differently doped layers: a first p-layer 804, a first n-layer 808, a second p-layer 812 and a second n-layer 816. The disk 412 thereby comprises several p-n junctions: a first p-n junction between the first p-layer 804 and the first n-layer 808 and a second p-n junction between the second p-layer 812 and the first n-layer 808, for example. The first p-n junction is aligned opposite the second p-n junction. The component 412 (when in the non-destroyed state) is therefore able to block the electric current in both directions. In the destroyed state of the component 412, on the other hand, the p-n junctions are no longer effective, and the electric current can flow in both directions.

The p-n junctions in the exemplary embodiment are designed as planar p-n junctions. The p-n junctions are aligned parallel to the first electric contact piece and/or parallel to the second electric contact piece.

The component 412 illustrated schematically in FIG. 8 has essentially the structure of a thyristor or of a four-layer diode (Shockley diode). In another exemplary embodiment, this component 412 can also have the structure of a simple diode. In this case, the component 412 would only have the first p-layer 804 and the first n-layer 808; only one p-n junction would thus be present in the component 412. In this case, the component 412 could only block the electric current in one direction.

Optionally, the component 412 can also be designed as an electrically switchable semiconductor element (in particular as a thyristor), whose control terminal (in particular its gate terminal) is brought out of the short-circuit device 400. The control terminal would then, for example, contact the second p-layer 812. The semiconductor component can then also be switched on (electrically) by means of its control terminal. This makes it possible to switch the short-circuit device on in two different ways: on the one hand by means of the actuator 608, which subjects the component to a mechanical force, and on the other hand by means of the control terminal of the semiconductor component (in particular the gate terminal of the thyristor). The first case leads to switching on the short-circuit device just one time, entailing destruction of the component 412, whereas the second case permits a reversible switching on, or a repeated switching on of the short-circuit device 400. The component can thus additionally be switched off in an electrically reversibly switchable manner. The short-circuit device 400 can thereby be used in a more versatile manner.

Figure 9:
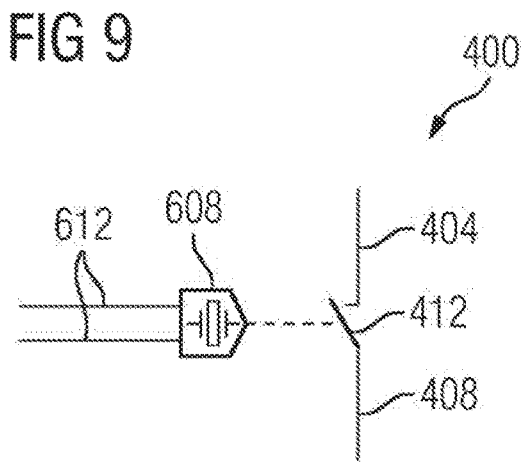
FIG. 9 shows an exemplary circuit symbol for the short-circuit device.

A circuit symbol for the short-circuit device 400 is illustrated symbolically in FIG. 9. It should be recognized that the short-circuit device 400 essentially represents a piezoelectrically actuated circuit closer that is provided for a single actuation or for a single switching on (one-time circuit closer, one-time circuit shorter).

When the short-circuit device is transferred from the non-short-circuiting state into the short-circuiting state, the following process takes place:

initially (before the trigger signal is applied to the actuator), a flow of electric current between the first contact piece and the second contact piece is blocked by the component in at least one direction. When the trigger signal is applied to the actuator, the component is subjected to a mechanical force by the actuator. The crystal structure of the component is at least partially (mechanically) destroyed by the mechanical force. As a result, the flow of electric current is enabled between the first electric contact piece and the second electric contact piece in the originally blocked direction. This is also referred to as breakdown of the component.

The short-circuit device 400 can also be referred to as a bypass disk cell. The short-circuit device 400 represents a non-pyrotechnically actuated short-circuit device, or a non-pyrotechnically actuated bypass switch. The short-circuit device 400 can be closed within very short times, for example within times less than one millisecond. This makes it possible in particular to use the short-circuit device 400 in power converters in order, in the event of a fault, to bridge defective modules of the power converter. By bridging the defective modules, the operating current of the power converter, and thereby the operation of the power converter, can continue to be maintained. The bypass switch 400 (the short-circuit device 400) is able, when in the short-circuiting state (in the closed state) to carry the operating current of the power converter reliably until the next servicing, and thereby to bridge (short-circuit) the defective module reliably.

An electric short-circuit device as well as a method for short-circuiting an electric module was described.

The invention claimed is:

1. An electric short-circuit device, comprising:
    a first electric contact piece;
    a second electric contact piece;
    a component made of an electrically semiconducting crystalline material that blocks a flow of electric current between said first electric contact piece and said second electric contact piece in at least one direction; and
    an actuator configured to apply a mechanical force to said component in response to an electric trigger signal and thereby at least partly destroy a crystal structure of said component.

2. The electric short-circuit device according to claim 1, wherein said component is disposed between said first electric contact piece and said second electric contact piece.

3. The electric short-circuit device according to claim 1, wherein the electric short-circuit device is configured as a disk cell.

4. The electric short-circuit device according to claim 1, wherein said first electric contact piece has a first recess formed therein and in said recess said actuator is disposed.

5. The electric short-circuit device according to claim 4, wherein said second electric contact piece has a second recess formed therein that is disposed opposite said first recess.

6. The electric short-circuit device according to claim 4, wherein said component separates said first recess from said second recess.

7. The electric short-circuit device according to claim 1, wherein said component is a disk.

8. The electric short-circuit device according to claim 1, wherein said component contains at least one p-n junction.

9. The electric short-circuit device according to claim 8, wherein said at least one p-n junction is a planar p-n junction that is aligned parallel to said first electric contact piece and/or parallel to said second electric contact piece.

10. The electric short-circuit device according to claim 1, wherein said actuator is a piezo actuator.

11. The electric short-circuit device according to claim 1, wherein said component contains two p-n junctions aligned in opposite directions.

12. A power converter, comprising:
    a plurality of two-pole modules connected electrically in series; and
    a plurality of electric short-circuit devices, one of said electric short-circuit devices assigned to each of said two-pole modules, each of said electric short-circuit devices containing:
        a first electric contact piece;
        a second electric contact piece;
        a component made of an electrically semiconducting crystalline material that blocks a flow of electric current between said first electric contact piece and said second electric contact piece in at least one direction; and
        an actuator configured to apply a mechanical force to said component in response to an electric trigger signal and thereby at least partly destroy a crystal structure of said component.

13. The power converter according to claim 12, wherein the power converter is a modular multilevel power converter.

14. A method for short-circuiting an electric two-pole module, wherein an electric short-circuit device containing a first electric contact piece, a second electric contact piece and a component made of an electrically semiconducting crystalline material is connected in parallel with the electric two-pole module, which comprises the steps of:
    initially blocking a flow of electric current between the first electric contact piece and the second electric contact piece by the component in at least one direction; and
    subjecting the component to a mechanical force by an actuator in response to an electric trigger signal, thereby a crystal structure of the component is at least partly destroyed, as a result of which the flow of electric current between the first electric contact piece and the second electric contact piece in an originally blocked direction is enabled.

15. The method according to claim 14, wherein the electric two-pole module has at least two electronic switching elements and an electric energy store.

16. The method according to claim 14, wherein the electric two-pole module is a module of a modular multilevel power converter.

17. The method according to claim 14, wherein the component is a disk.

18. The method according to claim 14, wherein the actuator is a piezo actuator.

* * * * *